Figure 1:
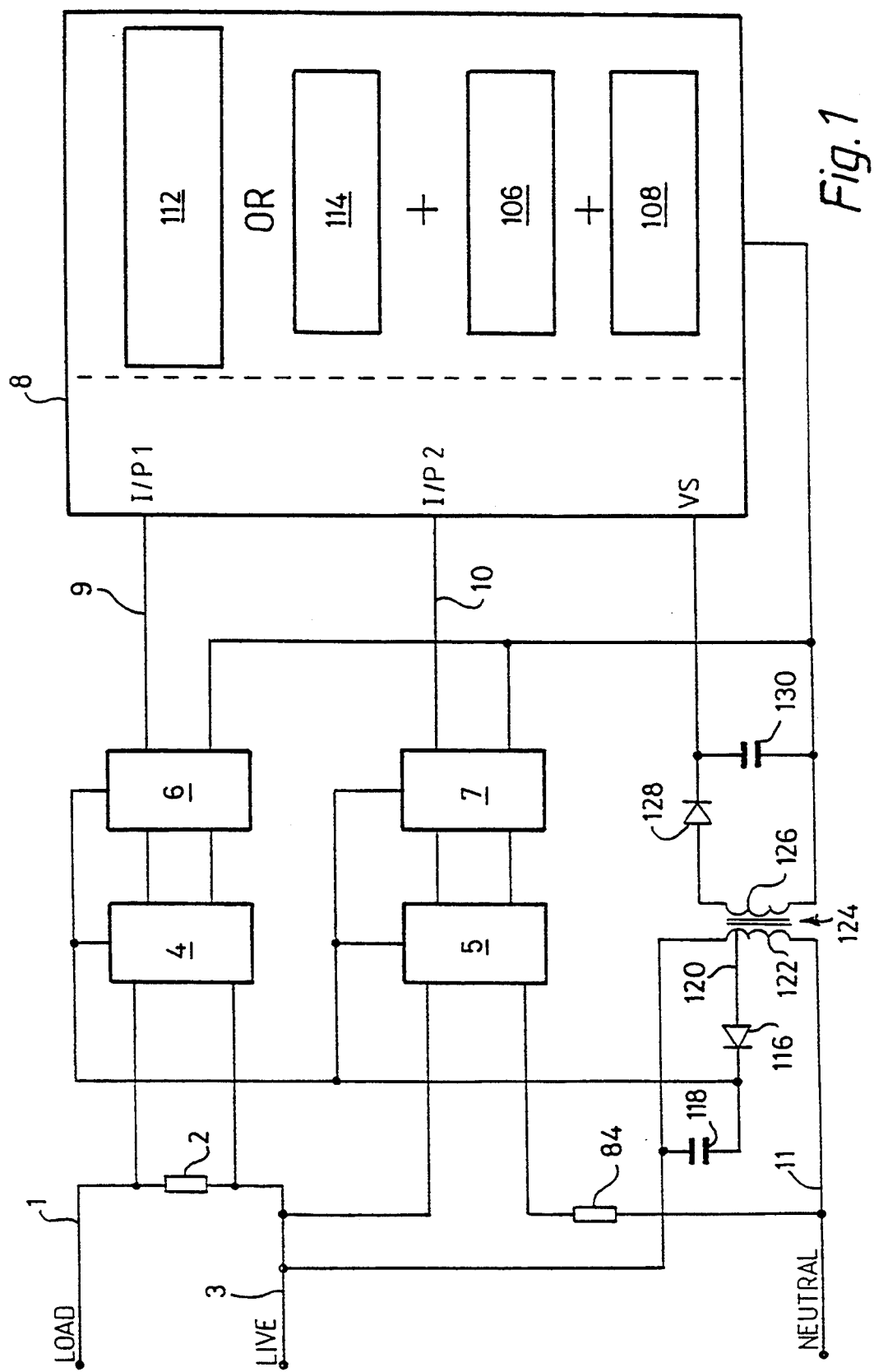

United States Patent [19]
Payne et al.

[11] Patent Number: 5,450,007
[45] Date of Patent: Sep. 12, 1995

[54] METHOD AND APPARATUS FOR POWER MEASURING

[75] Inventors: Kenneth Payne, Peterborough; Roger H. King, Thurlby Near Bourne; David A. Watson, Ely, all of United Kingdom

[73] Assignee: Ampy Automation-Digilog Limited, Peterborough, United Kingdom

[21] Appl. No.: 122,503

[22] PCT Filed: Sep. 11, 1992

[86] PCT No.: PCT/GB92/01664

§ 371 Date: Sep. 28, 1993

§ 102(e) Date: Sep. 28, 1993

[87] PCT Pub. No.: WO93/06493

PCT Pub. Date: Apr. 1, 1993

[30] Foreign Application Priority Data

Sep. 19, 1991 [GB] United Kingdom ............... 9120012

[51] Int. Cl.[6] .................................. G01R 21/00
[52] U.S. Cl. ..................... 324/141; 324/142; 364/483
[58] Field of Search ............ 324/142, 141; 328/160; 364/840, 483

[56] References Cited
PUBLICATIONS

"Electronics Communication" IBSN 0-13-250423-5 pp. 5, 131, 1983, Prentice-Hall.

*Primary Examiner*—Kenneth A. Wieder
*Assistant Examiner*—Mark Wardas
*Attorney, Agent, or Firm*—Lee, Mann, Smith, McWilliams, Sweeney & Ohlson

[57] ABSTRACT

A method for generating a product of signals proportional to the voltage of an electrical supply and the current flowing through a load connected thereto, comprises the steps of deriving a first signal proportional to the said supply voltage, deriving a second signal proportional to the load current, frequency modulating two constant frequency carrier signals by the said first and second signals to produce third and fourth signals respectively, normalizing the third and fourth signals with reference to frequencies corresponding to zero voltage and zero current, and multiplying the two normalized third and fourth signals to form a product signal which is proportional to the power being absorbed by the load connected to the electrical supply. The third and fourth signals comprise pulse trains whose instantaneous pulse repetition rate is proportional to the voltage and current. Apparatus is described for performing this method. A 555 timer device is employed for voltage to frequency conversation. A microprocessor is employed for multiplying the fifth and sixth signals and is programmed to compute therefrom not only the apparent power but also the apparent instantaneous power, the real energy and real power and also the reactive energy and reactive power supplied to the load.

24 Claims, 9 Drawing Sheets

METHOD AND APPARATUS FOR POWER MEASURING

FIELD OF INVENTION

This invention concerns the measurement of electrical power and methods and apparatus therefor.

BACKGROUND OF THE INVENTION

It is known to measure voltage and current to ascertain the power consumption from a supply typically an alternating current supply, by generating signals corresponding to the voltage and current, producing a product of the two signals and integrating the result over a period of time.

In recent years development work has been concentrated on meters incorporating solid state devices for performing some of the computations. Potentially such devices allow more accurate measurement than older electromechanical designs of meter and will also enable remote reading to be incorporated more readily into such meters.

Initially attempts were made to multiply analogue signals relating to current and voltage. Circuits adapted to accurately handle analogue signals and to multiply same, are complex and expensive and prone to drift with temperature and age which mitigate against accuracy.

European Patent Specification No. 0181719 discloses an alternative design in which the voltage and current signal are sampled and digitised and supplied as digital input signals to a microprocessor for multiplication within the processor to produce a digital signal whose value is proportional to the product of the input signals. In order to achieve higher accuracy than would otherwise be possible using eight bit A/D conversion on (or off) the processor, an alternating ramp voltage is generated and added to the input signals.

Although digital multiplication replaces the analogue multiplication of the earlier designs, the device described in EP 0181719 suffers from the disadvantage that an alternating ramp voltage has to be accurately generated and the combination requires the handling of analogue signals with all the inherent instability of analogue circuit brought about by variation due to temperature, humidity, age etc. It is an object of the present invention to provide a power measuring apparatus which does not require the generation and compensation of analogue signals before the signals are digitised but which nevertheless possesses at least the same level of accuracy as the apparatus described in European Patent Specification No. 0181719.

It is a further object of the invention to provide power measuring apparatus which can readily be isolated electrically from the supply to enable user access ports (such as a coin freed or card reader control) to be associated therewith.

It is a further object of the invention to provide power measuring apparatus from which information can be derived using telemetry or other remote sensing techniques to permit remote meter reading.

It is a further object of the invention to provide a method of measuring power which does not require the generation and accommodation of analogue signals before the digitisation of current and voltage signals for multiplication.

SUMMARY OF THE INVENTION

According to one aspect of the present invention there is provided power measuring apparatus adapted to produce an output signal proportional to the product of a supply voltage and current flowing through a load connected t thereto, in which a first analogue signal is derived proportional to the said supply voltage and a second analogue signal is derived proportional to the said load current so that a product signal can be produced by a microprocessor corresponding to the power, characterised in that third and fourth signals are produced by frequency modulating two constant frequency carrier signals using the said first and second signals and the said third and fourth signals are supplied to the microprocessor for multiplication to produce the power product signal, in place of the analogue first and second signals.

The advantages of the invention are greater stability with time and temperature and the signals are now in binary form and can be transmitted via electrical isolating devices to enable a user accessible port to be associated with the apparatus. Typically opto-isolators are employed.

The invention thus also lies in an electrical power measuring apparatus as aforesaid in which the said third and fourth signals are transmitted to the microprocessor via electrical isolating devices such as opto-isolators. However it is to be understood that such isolation of the microprocessor from the third and fourth signals is optional and not essential in all cases.

The first and second signals are preferably in the form of analogue voltages and may be derived using potential dividers and shunts in known manner. The signals may be obtained without electrical isolation from the supply line but if desired, isolation may be achieved using one or more transformers.

Where one or both of the first and second signals is or are an electrical current this is preferably converted into a voltage in any convenient manner so that both first and second signals are in the form of electrical voltages.

The signal to frequency conversion is most simply effected using voltage controlled pulse generators in which the instantaneous frequency of the pulses from each is controlled by the instantaneous value of the first and second signal voltages respectively.

According to another aspect of the invention a method of processing the third and fourth frequency varying signals may comprise the following steps:
1. generating a constant frequency clock signal having a frequency many times that of the mean frequency of the said third and fourth signals,
2. continually entering said clock pulses into a counter means,
3. capturing a first value of the counter means at the beginning of each of the pulses making up the said third signal and likewise capturing a second value of the counter means at the beginning of each of the pulses making up the said fourth signal,
4. for both the first and second values, subtracting the previous captured value from the current captured value derived from each counter to form third and fourth difference signals,
5. forming the arithmetical reciprocal of each of the said third and fourth difference signals,
6. subtracting from each said reciprocal a frequency value equal to the mean frequency of the said third and fourth signals to form fifth and sixth signals, and 7. supplying the fifth and sixth signals to a quadrature multiplying device and supplying the output thereof as the power signal.

If the signal to frequency conversion of the voltage and current signals operates without error then the frequency value to be subtracted from the third and fourth difference signals is a fixed frequency which equates to the value of the frequency corresponding to zero voltage and zero current where the supply is an alternating supply having a generally sinusoidal waveform.

The invention also lies in a method of generating a product of signals proportional to the voltage of an electrical supply and the current flowing through a load connected thereto, comprising the steps of deriving a first signal proportional to the said supply voltage, deriving a second signal proportional to the said load current, frequency modulating two constant frequency carrier signals by the said first and second signals to produce third and fourth signals respectively, normalising the third and fourth signals with reference to frequencies corresponding to zero voltage and zero current, and multiplying the two normalised third and fourth signals to form a product signal which is proportional to the power being absorbed by the load connected to the electrical supply.

The invention also lies in apparatus for processing the aforementioned third and fourth signals comprising:

1. a clock pulse generator for producing a clock pulse signal having a frequency many times that of the mean frequency of the third and fourth signals,
2. two counters to which the clock pulses are supplied continually,
3. circuit means for capturing the value in each of the counters,
4. circuit means responsive to the said third and fourth signals for controlling the capture means to capture the counter values at the beginning of each pulse which appears in the said third and fourth signals respectively,
5. means for storing each captured value,
6. means for subtracting the stored captured value from the currently captured value before the currently captured value is inserted into the storage means to form third and fourth difference signals,
7. circuit means adapted to form the arithmetical reciprocal of each of the said third and fourth difference signals,
8. means for deriving the mean frequency of the said third and fourth signals,
9. circuit means for subtracting the said mean values from the reciprocals of the two difference signals to form fifth and sixth signals, and
10. quadrature multiplying means receptive of the said fifth and sixth signals to provide an output signal corresponding to the power being absorbed by the load connected to the said electrical supply.

Preferably a microprocessor is employed for effecting the multiplication of the fifth and sixth signals and the processor is programmed to compute therefrom not only the apparent power but also the apparent instantaneous power, the real energy and power and also the reactive energy and power supplied to the load.

According to another aspect of the invention one or both of the aforementioned third and fourth signals may be averaged over a period of time to provide automatic zero power calibration of the apparatus.

In practice it is only necessary to ensure that one of the computed values reliably reverts to zero when no power is being drawn and since the current waveform can become very unsymmetrical in the presence of certain loads (such as ½ wave rectifying circuits) preferably the averaging is applied to the said third signal (ie the voltage related signal).

The invention is equally applicable to single or multiple phase electrical supply metering. For single phase metering it is only necessary to measure the current in one line whereas for multiphase supplies, it is of course necessary to measure at least the current in each of the phases and if appropriate the voltage relating to each phase to produce three power signals which must be summed in order to produce a total power signal for the multiple phase supply.

Insofar as phase modulation is in many ways equivalent to frequency modulation, the third and fourth signals may be produced by phase modulation of the constant frequency signals in which event changes may be needed to the processing of the said third and fourth difference signals to produce the said fifth and sixth signals to take account of the fact that phase modulation has been used as opposed to frequency modulation.

Any of the apparatus as aforesaid may be combined with a coin freed mechanism or card reader to provide for prepayment of electricity.

Likewise any of the apparatus as aforesaid may be combined with means for remote reading and remote control of the meter by any telemetering method or by power line signal modulation techniques and the meter accordingly may include receiver and/or transmitter means for decoding data transmitted to the meter and appropriately modulating a carrier for transmission of data from the registers contained in the meter relating to example to the accumulated power measured by the meter.

Any of the apparatus as aforesaid may include switch means for interrupting the supply of electric current from the meter to the load. The switch means may be remotely controllable as by telemetry (for example power line signal transmission). Where receiver means is included for said remote control the receiver may be adapted to generate a control signal for operating the switch means on or off in response to the receipt and decoding of an appropriate command signal. Provision may be made for local operation of the switch means.

Any of the apparatus as aforesaid may include display means such as an LCD display or the like for displaying in aloha numeric characters the accumulated power measured by the meter.

The invention overcomes the shortcomings of earlier attempts to produce solid state power metering devices, by supplying the microprocessor with information about both current and voltage in a binary form. This means that a derived power or energy parameter can be calculated in known manner and the multiplication can be performed in a four quadrant digital multiplier within a microprocessor. Digital multipliers are accurate, do not suffer from drift and there is no problem with dynamic range as long as the correct number of bits is selected for the application.

Previous methods have also been proposed using multiplexed analogue to digital converters. However, inaccuracies have arisen in practice because of the large number of bits required in the conversion and because the incident waveforms are not sampled concurrently in multiplexing techniques. The invention overcomes both of these problems and it is important to note that in the present invention the instantaneous values derived for the current and voltage are those which are occurring simultaneously in time so that a true simultaneous multiplication of current and voltage is achieved using the present invention.

The means for producing the third and fourth signals may be considered to comprise means adapted to be connected to an electricity supply for producing:

a. an output signal proportional to the potential difference between the live and neutral wires of the supply, and b. an output signal proportional to the current flowing in the live wire of the supply, wherein:

(c) current sensing means is provided for producing a signal relating to the instantaneous magnitude of the current flowing in the live wire, and first frequency modulation circuit means is provided for converting this signal into a continuous pulse waveform whose frequency is representative of the current, and (d) a voltge sensing means is provided for producing a signal proportional to the instantaneous magnitude of the potential difference between the live and neutral wires of the supply and second frequency modulation circuit means is provided for converting this signal into a pulse train whose frequency is representative of the potential difference.

Since the voltage and current signals are now in the form of binary signals (ie pulse trains) the frequency of each of which contains the information relating to variation of voltage and current respectively, it is possible to employ simple electrical isolation such as opto-isolators for transferring the information to a microprocessor based circuit thereby enabling power derived directly from the live and neutral lines of the power supply to be used for powering the voltage and current frequency modulation circuits.

According to another aspect of the invention voltage to frequency conversion may be achieved by controlling the frequency of a free running oscillator set to produce pulses of a frequency F (where F is significantly greater than the frequency of the oscillating current supply) so that as the instantaneous voltage of the supply increases from zero up to a positive peak then decreases through zero to a negative peak and back again to zero during a cycle, so the pulse production rate increases from the rate at zero voltage up to the positive maximum and then decreases through zero pulse rate and continues to decrease until the negative maximum is reached and thereafter increases once again to the zero voltage pulse rate at the end of each cycle.

By reversing the polarity of the supply voltage (or proportion there of which is fed to the pulse repetition rate controlling terminal of the oscillator), so the frequency can be varied in an opposite sense during each cycle, firstly decreasing (as the supply voltage increases) and then increasing (as the supply voltage collapses and reverses polarity) and lastly decreasing again as the supply voltage once again increases towards zero to complete the cycle.

According to a preferred feature of this aspect of the invention an integrated circuit timing device whose relaxation period is controlled at least in part by a potential difference between two of its pins, may be employed.

Such a device comprises a type 555 timer.

The mean pulse repetition rate (ie when zero voltage appears between the said two pins), of such a device, is determined by an external RC circuit and typically a mean repetition rate of 2000 Hz is employed if the supply frequency is 50 Hz.

Figure 2:
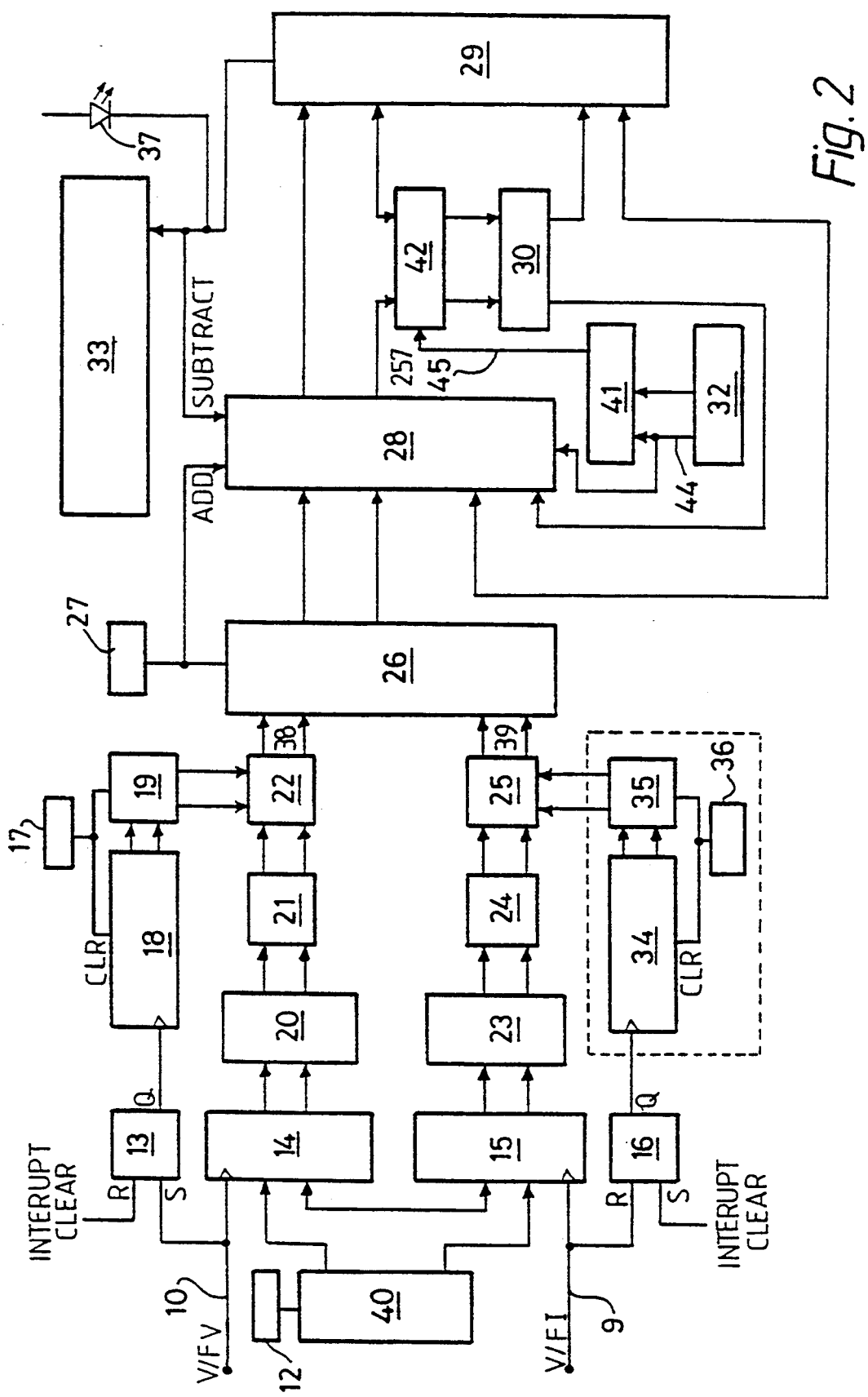
Figure 3:
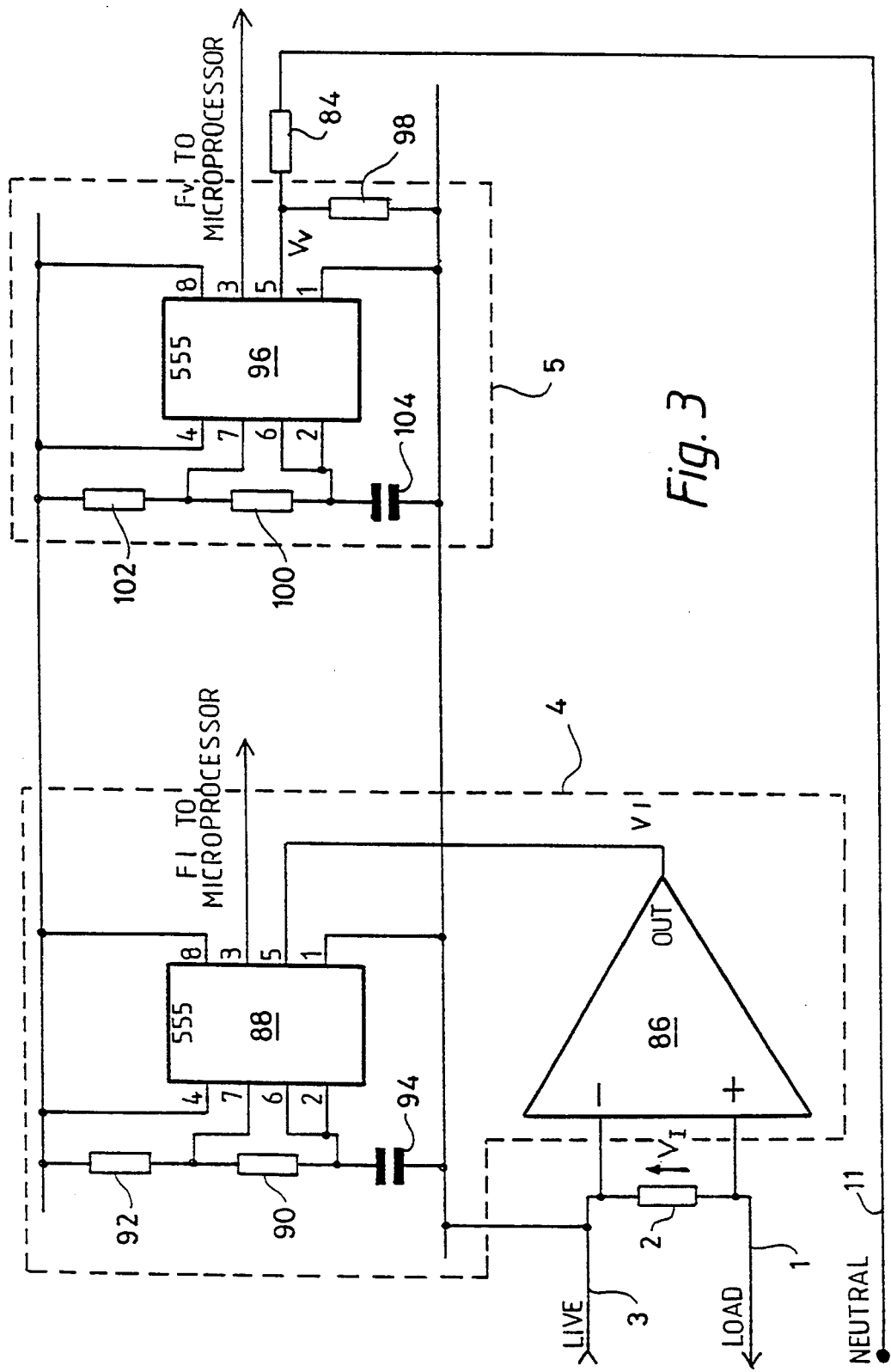
Figure 4:
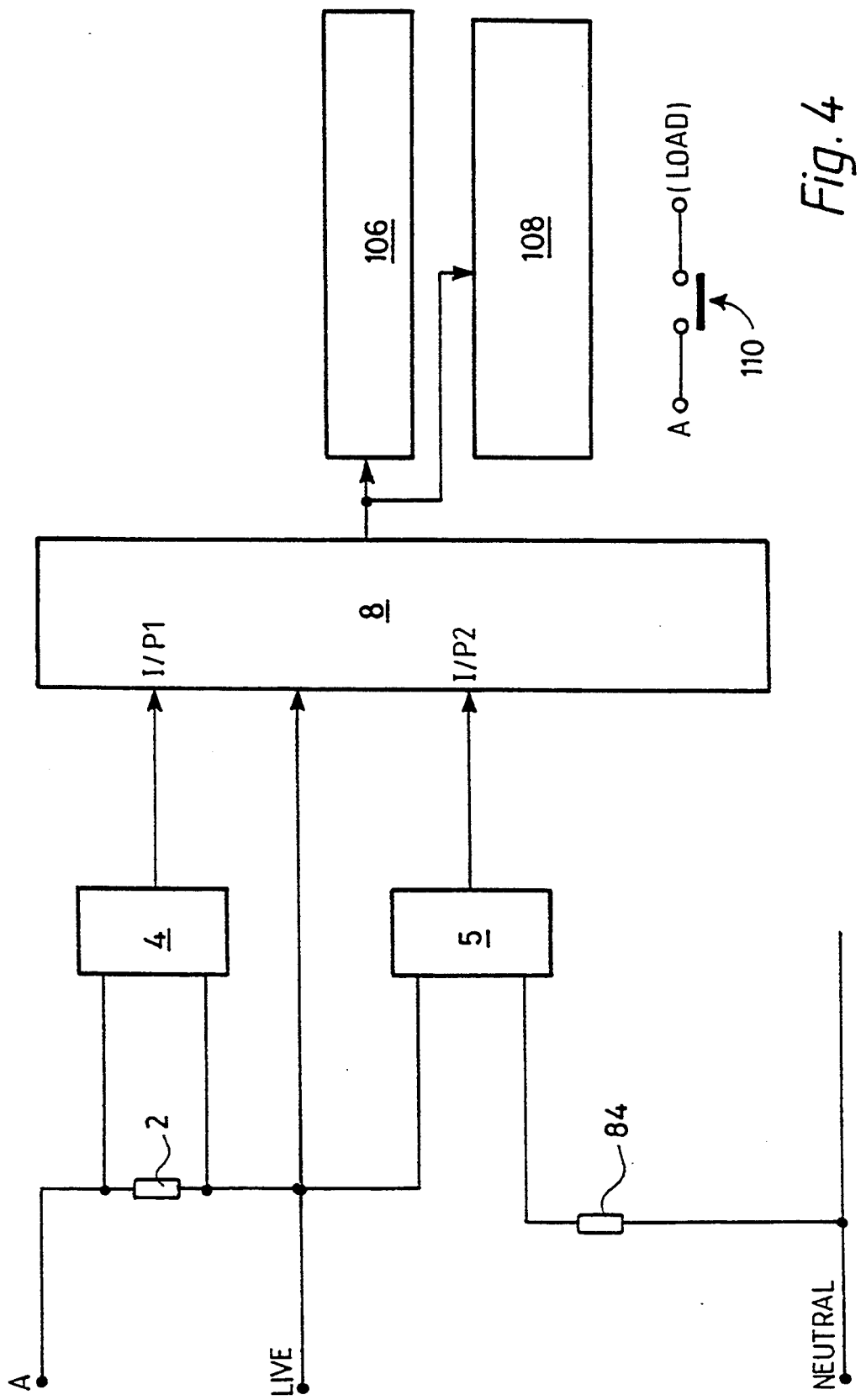
Figure 5:
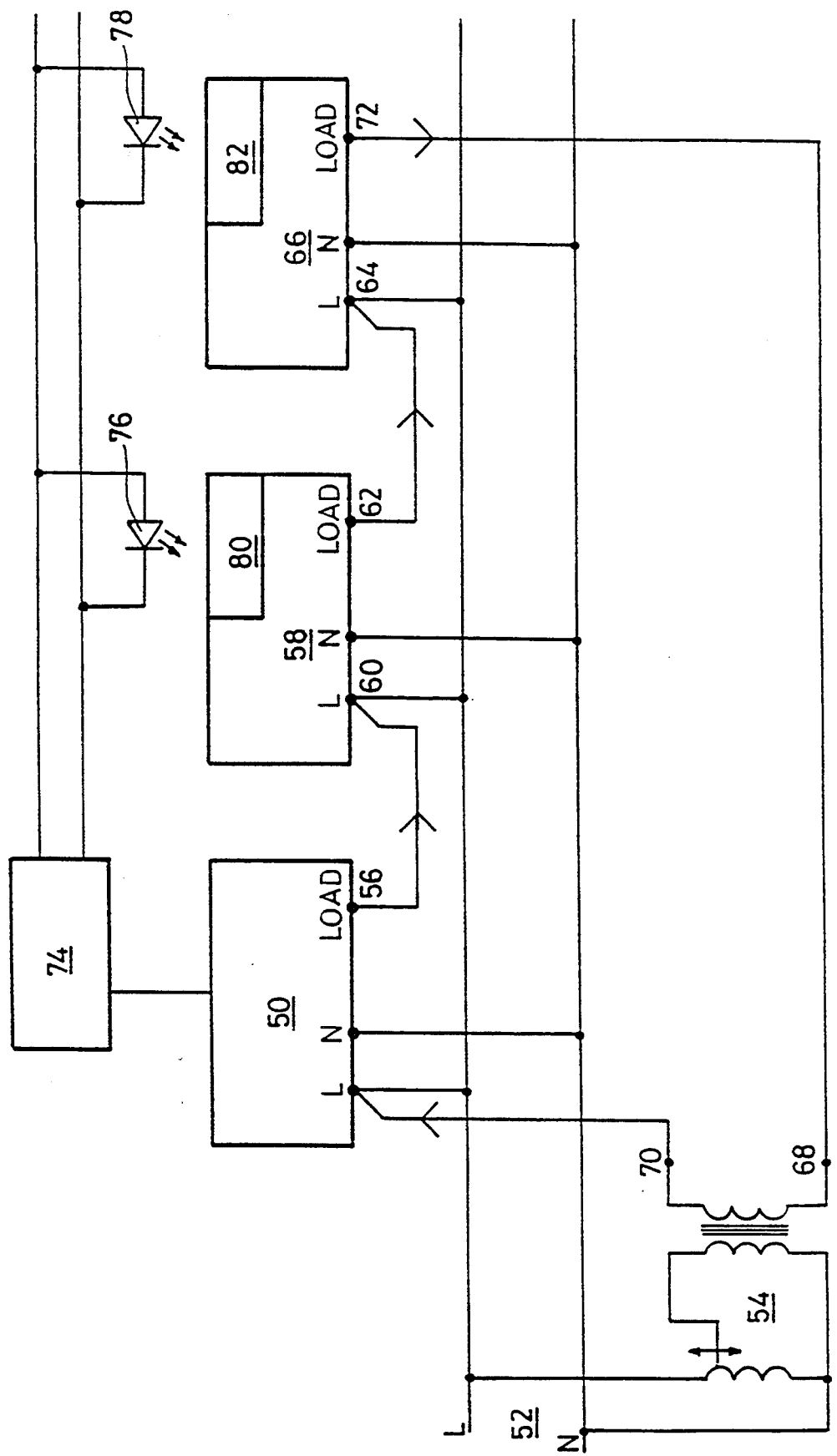
Figure 6:
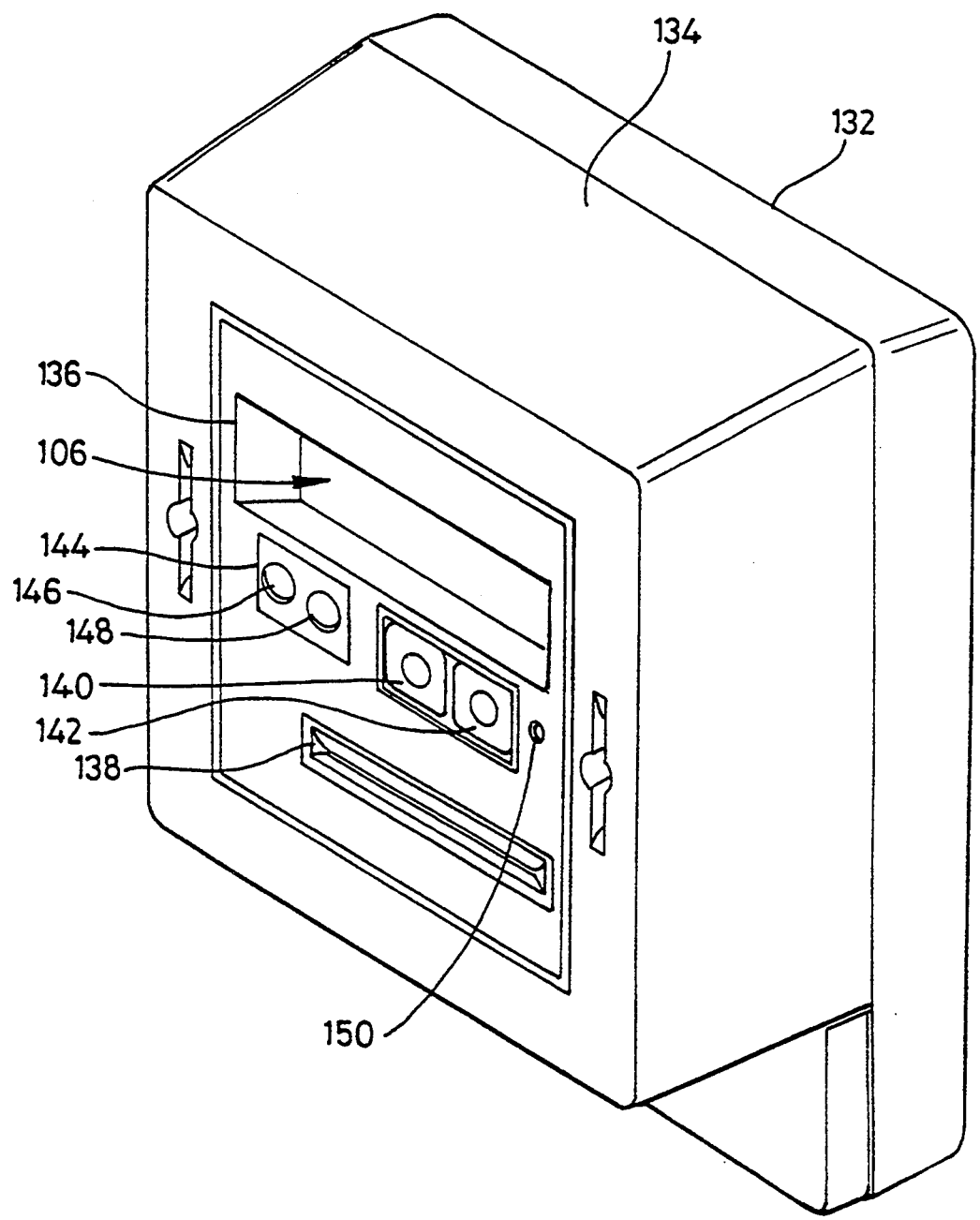
Figure 7:
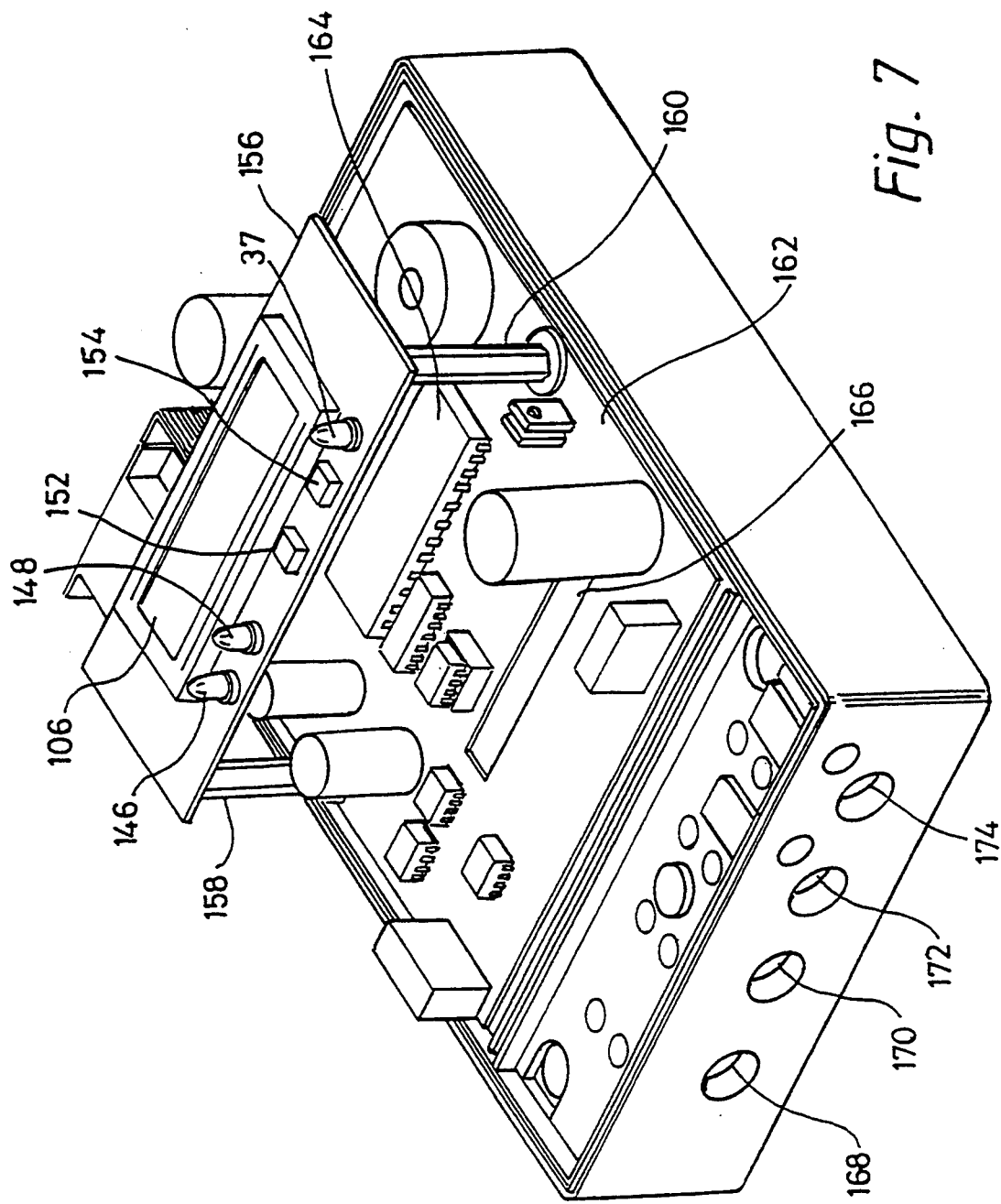
Figure 8:
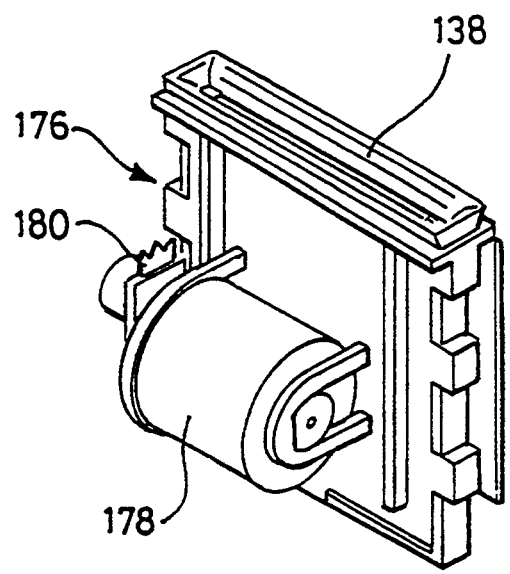
Figure 9:
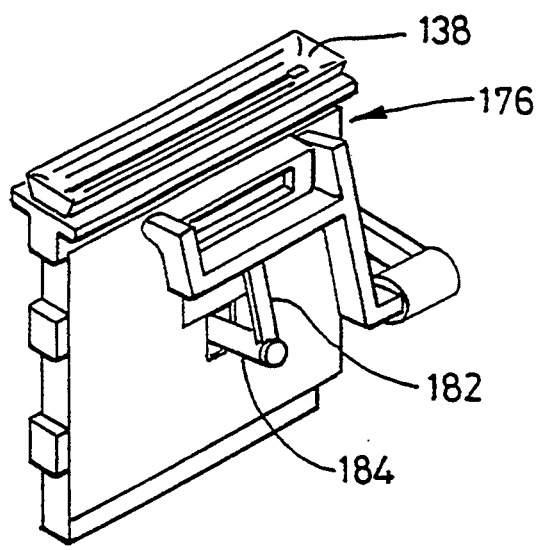
Figure 10:
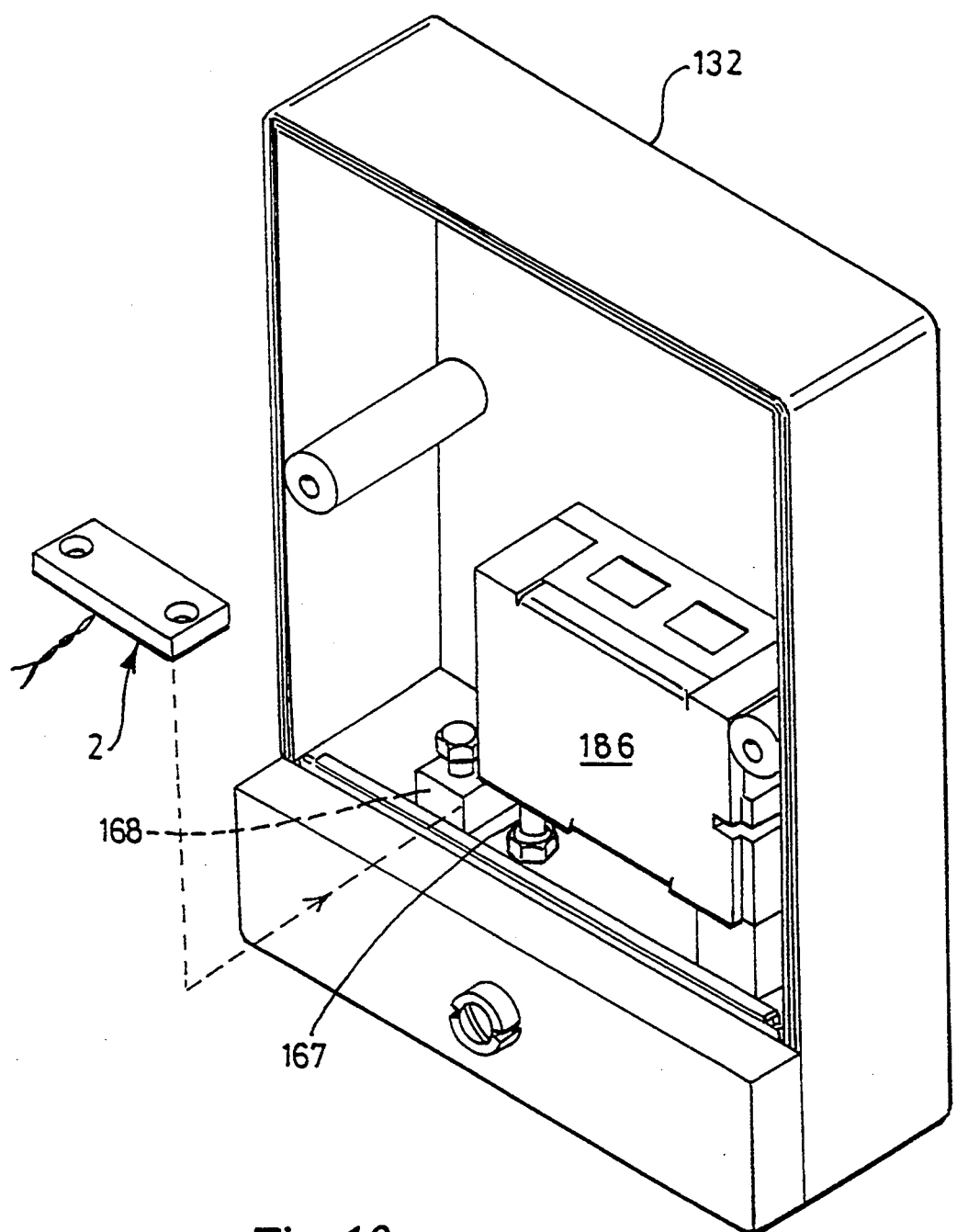

The invention will now be described by way of example with reference to the accompanying drawings, in which:

FIG. 1 is a simplified block circuit diagram of a meter embodying the invention, FIG. 2 is a block circuit diagram of the elements which make up the processor employed in FIG. 1, FIG. 3 comprises a block circuit diagram of the voltage and current to frequency converters of FIG. 1, FIG. 4 illustrates a simplified form of meter based on FIG. 1 in which no opto-isolation of the processor is required from the voltage to frequency and current to frequency circuits, FIG. 5 illustrates how two or more meters can be connected to a so-called substandard meter for simultaneous calibration, FIG. 6 illustrates a card controlled meter embodying the invention in its protective housing, FIG. 7 is a perspective view of the interior of the meter with the front housing cover and card reader removed, FIG. 8 is a perspective view of the card reader from one side, FIG. 9 is a similar view of the card reader from the other side, and FIG. 10 is a perspective view of the rear of the meter housing with the pcb and card reader removed, to reveal the contactor and current shunt.

Referring to FIG. 1, the instantaneous potential of the mains supply is measured between the live line 3 and the neutral line 11 of a domestic supply. The voltage is converted to a pulse train by the voltage to frequency converter 5 which has a free running frequency of approximately 2,000 Hz which is modulated up or down in frequency depending on the polarity and amplitude of the potential excursion. Typically the base frequency is modulated by the supply voltage waveform signal to produce a frequency modulated signal with a deviation of plus or minus 200 Hz. The deviation is proportional to the instantaneous voltage of the waveform. The pulse train produced by the frequency to voltage converter 5 is coupled to input 1 of a processor 8 via an opto-isolator 7.

The instantaneous current flowing is measured by measuring the potential generated across a shunt resistor 2 connected in series with a live wire 3 of the supply to the consumer. This voltage is converted to a pulse train by a voltage to frequency converter 4 which also has a free running oscillator operating at a frequency of approximately 2,000 Hz. This base frequency is modulated by the supply current waveform signal to produce a frequency modulated signal with a deviation of plus or minus 200 Hz full scale. The deviation is proportional to the instantaneous current flowing to the consumer and the pulse train is coupled via an opto-isolator 6 to a second input of the processor 8.

The processor 8 provides signals for driving a display 106 (typically liquid crystal display) to indicate under normal operation, the accumulated numerical value of units of power measured by the meter, (as will be described in more detail with reference to FIG. 2).

Likewise a contactor 108 may also be controlled by an output signal from the processor.

The contactor is preferably a pulse operated device held into its last switched state by a spring or permanent magnet or both.

The contactor is only required if ON/OFF control of the supply to the consumer/load is required as in the case of a coin or a card controlled meter or a meter which is to be remotely controlled by the supply authority as by power line modulation.

Where provided, a power line signalling receiver or transmitter/receiver 112 provides control signals for the processor or receives data from the processor for transmission to the supply authority—as for example to indicate a fault condition in the meter or relay to the authority the accumulated value of measured power.

The card reader 114 likewise is controllable by signals from the processor and in turn produces electrical signals serving as signal inputs to the processor. Thus the processor may produce a signal to enable the card reader, cancel data on a card after it has been read, may receive data read from an inserted prepayment card for validating the card and can indicate to the processor the number of units to be permitted before requiring a further card to be inserted.

DC power for the voltage/current to frequency converter circuits 4 and 5 and the driving elements of the opto-isolators is derived from a halfwave rectifying circuit made up of diode 116 and reservoir/smoothing capacitor 118. Typically the DC voltage requirement is of the order of a few volts for example 5-15 volts, and since the ac supply voltage will normally be 240 volts RMS or the like, a tapping 120 on the primary winding 122 of a transformer 124 can provide the lower ac voltage needed as input to the rectifying circuit 116/118.

Where isolation of the processor is required (as is essential if user accessible ports are provided on the meter), the dc power for the processor (and display, card reader, powerline communication receiver/transmitter, contactor etc when fitted) is derived from a second rectifying circuit supplied from the secondary winding of the transformer 124 and comprising diode 128 and smoothing/reservoir capacitor 130.

The processor may be an integrated circuit capable of performing all the functions in FIG. 2, or an array of devices which collectively can perform the said functions.

In order to obtain the values of voltage and current, the processor has to measure the time between pulses. In the example shown this is achieved by the same method for both current and voltage, and will be described with reference to FIG. 2.

For simplicity the processor will be assumed to be a single integrated circuit ie a customised microprocessor chip.

Also for simplicity the controlling (central processing) element of the customised device of FIG. 2 is not shown, nor are the signal paths between it and the individual processing elements shown in FIG. 2.

A 16 bit counter 40 is continuously clocked by a crystal controlled oscillator 12 running at 5 MHz.

The output of the counter is connected in parallel to the inputs of two 16 bit latches 14 and 15. Latch 14 relates to the voltage and latch 15 to current.

The clock inputs of the respective latches are fed with the pulse trains of lines 9 and 10 respectively.

On the positive edge of a pulse on line 10, the value of the counter 40 is stored in the latch 14. The edge also provides an interrupt via the interrupt request register 13. The interrupt causes the value stored in the latch 14 to be read. To obtain a number indicative of the period between pulses, the value of the previous count is subtracted from the newly counted value in a subtractor 20. To produce a value proportional to frequency, the period is inverted by inverter stage 21 to produce the arithmetical reciprocal.

Simultaneously with the above counting and latching sequence, another counter 18 and latch 19 average the incoming voltage related frequency over a 40 second period determined by a timer 17. This average voltage related frequency is then subtracted by 22 from the instantaneous voltage related frequency to give numerical output value at 38 proportional to the instantaneous voltage. This feature allows the voltage "base" frequency to be continuously autozeroed to cater for long term drift.

A second channel accepts the signal representative of current along line 9 and produces a value 39 proportional to the instantaneous current in exactly the same way as the signal 38 is produced corresponding to voltage.

The current value channel has a similar arrangement to the voltage channel for producing an average value of the current related frequency, but typically this is only performed once during calibration, during manufacture.

The items concerned are labelled 34, 35 and 36. The average or base current related frequency value is subtracted from the values of instantaneous current frequency which arise during use, giving a frequency value proportional to the instantaneous current, for supply as signal 39.

The two signals 38 and 39 are the inputs to a four quadrant multiplier 26. As these two signals are asynchronous, the multiplication is caused to occur at regularly occuring intervals of time displaced by, for example, 500 microseconds. A suitable timing or interrupt circuit 27 produces the necessary control signals for the multiplier. The latter uses the input signal present at 38 and 39 at each instant in time and each result is then passed to an accumulator 28 which keeps a total of the power consumed. The running total in the accumulator is compared in the comparator 29 with a number, from register 30 which is equivalent to a 1/1000th of a kilowatt hour. When this value is reached or exceeded a current pulse is generated causing the kilowatt hour register 33 to be incremented by one and if desired a front panel light emitting diode (LED) 37 can be triggered to flash. The value in 30 is also subtracted from the register (accumulator) 28 in response to the generation of the count pulse.

It is to be noted that if the value in the register 28 is greater than the value from 30 the excess will remain in the register 28 and will count towards the new accumulating value in the register. This significantly improves the accurancy of the measuring technique since in this way no part of any power signal computed by multiplier 26 will be lost and over a long period of time the shortfall in the kilowatt hour register 33 would be quite considerable if the overflow amounts left in the accumulator register 28 were (in fact) to be disregarded.

The number used to indicate a 1/1000th of a kilowatt hour is at least initially adjustable to enable calibration of the meter against a standard. This provides a method for calibration of the meter during manufacture and if required following any subsequent refurbishment.

The processor 8 may include memory means (not shown) in which one or more programmes or instructions can be stored for recall in response to appropriate interrupts and/or input signals, to cause the processor to perform the functions described in relation to FIG. 2.

FIG. 3 illustrates a preferred circuit for providing two frequency modulated signals corresponding to the instantaneous values of supply voltage and load current of FIG. 1.

Certain of the components and connections are common to elements in FIG. 1 and to this end the same reference numerals have been employed.

The shunt should develop the smallest possible potential difference $v_I$. To this end a differential amplifier 86 is employed to generate a larger signal $V_I$ for supply to pin 5 of a type 555 timer 88.

Mean frequency controlling circuit elements 90 and 92 provide potentials for pins 2, 6 and 7 and a charging-/discharging capacitor 94 is connected between pin 2 (which is also connected to pin 6) and the live line. Pin 3 provides the $F_I$ output signal which may be supplied directly to the processor 8 (as shown in FIG. 4) or via an opto-isolator 6 as shown in FIG. 1.

A second 555 timer 96 forms the basis of the supply voltage to frequency converter 5. A small fraction of the supply voltage (between the LIVE line 3 and the NEUTRAL line 11) is produced by a potential divider made up of resistors 84 and 98. The desired small fraction appears across the resistor 98. This potential difference appears between pins 1 and 3 of 96. As before the mean frequency of operation of 96 is controlled by RC elements 100, 102 and 104 and typically the resistors 100 or 102 or both are made adjustable so that the frequency of 5 can be made the same as that of 4. (Alternatively or additionally the resistor 90 or 92 or both may be made adjustable). As before the $I_F$ signal is derived from pin 3 of the 555 device and is supplied either directly (as shown in FIG. 4) or via an opto-isolator 7 as shown in FIG. 1, to the second input of the processor 8.

FIG. 4 merely shows diagrammatically how in a simple meter (in which there is no user accessible port such as coin freed mechanism or card reader) but merely a display with or without a contactor for local or remote ON/OFF control of the supply, the need for opto-isolators is removed. To this end the processor 8 is at LIVE rail polarity as is consequently the display 106 and actuator coil of the contactor 108 if provided. Where the latter is provided the LOAD terminal is connected to the terminal A of FIG. 4 via the contacts 110. The latter is to advantage a spring and/or permanent magnet assisted contactor requiring positive and negative pulses only for operation to open and close the contacts 110.

Where the contactor is not required, the load is connected direct to terminal A.

Calibration is usually performed by comparing the power measured by a meter under test with the power measured by a "standard meter" set to measure the same voltage and current parameters over the same period of time. Although a so-called standard quality meter is ideally used, in practice meters which are not quite up to standards quality may be used as the reference and such meters are commonly referred to as sub-standard meters.

Such a meter is that produced by Landis and Gyr under the code TVE 102/1. These meters deliver an electrical pulse for each 1/500,000th of a kilowatt hour measured by the meter. Each such pulse is called a unit power pulse.

As described with reference to FIG. 2 the numerical value with which the accumulated value being registered at 28 is to be compared (to determine when a 1/1000th of a kilowatt hour has been registered by the meter) can be adjusted for calibration purposes. This numerical value is held in the register 30.

Since the pulses to be accumulated by the meter under test should correspond to 1/1000th kilowatt hour, an interface 74 is provided which includes divider devices (not shown), typically CMOS type CD 4510B connected to provide a 500:1 ratio, so that one value is delivered by the interface for every 500 pulses received from the "standard" meter 50.

The permanent value for register 30 is arrived at by feeding via optical port 32 pulses from the interface 74 to a counter 41. The value in counter 41 is initially set to zero by a reset pulse on line 44. This reset pulse may for example be the first to arrive of a sequence of pulses from the sub-standard meter or a specially generated reset pulse. The incrementing value in register accumulator 28 is also reset to zero by the same reset pulse on line 44. If (as is arranged) both meters are set to measure the same voltage and current, pulses arriving from the sub-standard meter via interface 74 and port 32 increment the counter 41, and in a similar manner the numerical value in the register accumulator 28 is incremented by the action of the power measuring circuits of the meter under test as described with reference to FIG. 2.

Counter 41 is set to generate an output pulse when N pulses have been received from the interface 74 and this trigger is supplied to the divider 42 to divide the numerical value which has been accumulated in the accumulator register 28 by the value N to produce a numerical value for latching into the register 30.

The value of N may be 256 to simplify the division step and ensure a relatively long period in which the sub-standard meter output is compared with the meter or meters under test. To this end the arrival of the 257th pulse can be used to serve as the trigger to generate the divider instruction pulse along line 45.

It is to be understood however that the numerical value N is quite arbitrary and any value can be chosen which is convenient and sufficiently large enough to ensure that enough unit power pulses have been received to ensure an accurate value after division by N for insertion in the register 30.

After the comparator register 30 is latched it is preferably WRITE-inhibited in any known manner to prevent unauthorised recalibration of the meter.

As shown in FIG. 5 a sub-standard meter 50 may be connected between the L and N terminals of a supply 52 and is received current from the terminals 68, 70 of the secondary of a current transformer 54.

One terminal 70 of the current transformer secondary is connected to the L terminal of the sub-standard meter 50 and in order to ensure that the same current passes through the current measuring circuits of all the meters, the LOAD terminal 56 of the sub-standard meter is connected to the LIVE terminal 60 of the first meter under test 58 and the LOAD terminal 62 of that meter is connected to the LIVE terminal 64 of the next meter under test 66 and so on, until the last meter in the chain where the LOAD terminal is connected to the terminal 68 of the load.

In FIG. 5 only two meters are shown under test and it is therefore the LOAD terminal 72 of the second meter 66 which is connected to the load terminal 68.

In order to convey unit power pulses from the sub-standard meter 50 to a number of meters under test 58 and 66 etc, the interface unit 74 pulses serve to drive a chain of LEDs 76, 78 etc and cause the latter to flash in synchronism therewith. By positioning each LED 76, 78 etc opposite the opto communication ports 80, 82 respectively of the meters under test, so the pulses derived from the unit power pulses from the sub-standard meter 50 can be used to calibrate all of the meters in the chain.

The assembled meter of FIGS. 1 and 2 is shown in FIG. 6 within a two part housing comprising a base unit 132 and front cover 134. The latter is adapted to be panel or wall mounted and the front cover includes a panel containing a viewing window 136 through which a display 106 can be seen. The slot of a card reader 106 is shown at 138 and finger operable control buttons 140 and 142 allow the meter to be programmed after appropriate instructions have been entered via an opto communications port 144 containing an LED 146 and light sensitive transistor 148.

The LED 37 which flashes when unit power pulses are generated is also visible through the window 150.

Removing the front cover and card reader allows the inside of the meter to be seen as shown in FIG. 7. Here the display 106 is shown mounted on a small pcb 156 carrying also the receiver and transmitter units 146, 148 of the opto communications port 144, switches 152 and 154 operable by the press pads 140 and 142 in FIG. 6, and the LED 37 (of FIG. 2). The small pcb 156 is mounted by standoffs 158 and 160 from the main pcb 162 on which is mounted a central processor chip 164 and related power supplies and buffer circuit elements, the opto isolators, the 555 timer devices 88, 96, the differential amplifier 86 and related decoupling and signal coupling paths and devices. A slot 166 is provided into which the inboard end of a card reader can be fitted and located.

Cable connections are provided at 168, 170, 172 and 174 for connecting the Live, Neutral In, Neutral Out and Load (ie for example the live busbar of a domestic supply).

FIGS. 8 and 9 show the card reader as comprising a shallow box-like member 176 defining a slot 138 at one end and having on one face a DC motor 178 adapted to draw in and eject cards via a claw drive 180 and on the other face an erasing device comprising a pivotted arm 182 bearing a permanent magnet 184 which during reverse movement of the card (not shown) is moved under the action of the motor drive into contact with the magnetic stripe on the card to erase magnetic data stored thereon.

Reading and writing control circuits for receiving signals from and supplying signals to a read/write head (not shown) also mounted on one face of the box 176, are also carried by the latter.

Beneath the main pcb 162 as shown in FIG. 10, is located a contactor 186 which for convenience supports the shunt 2 (of FIG. 1) itself connected between one terminal 167 of the contactor and one of the cable connectors 168 etc of FIG. 7.

We claim:

1. A method of generating a product of signals proportional to the voltage of an electrical supply and the current flowing through a load connected thereto, comprising the steps of deriving a first signal proportional to the said supply voltage, deriving a second signal proportional to the said load current, frequency modulating two constant frequency carrier signals by the said first and second signals to produce third and fourth signals respectively, normalising the third and fourth signals with reference to frequencies corresponding to zero voltage and zero current, and multiplying the two normalised third and fourth signals to form a product signal which is proportional to the power being absorbed by the load connected to the electrical supply.

2. A power measuring method as claimed in claim 1 wherein the processing of the third and fourth frequency varying signals comprises the steps of:
    a) generating a constant frequency clock signal having a frequency many times that of the mean frequency of the said third and fourth signals,
    b) continually entering said clock pulses into a counter means,
    c) capturing a first value from the counter means at the beginning of each of the pulses making up the said third signal and likewise capturing a second value from the counter means at the beginning of each of the pulses making up the said fourth signal,
    d) for both the first and second values, subtracting the previously captured value from the currently captured value derived from the counter means to form third and fourth difference signals,
    e) forming the arithmetical reciprocal of each of the said third and fourth difference signals,
    f) subtracting from each said reciprocal a frequency value equal to the mean frequency of the said third and fourth signals to form fifth and sixth signals, and
    g) supplying the fifth and sixth signals to a quadrature multiplying device and supplying the output thereof as the power signal.

3. A method as claimed in claim 1 wherein at least one of the said third and fourth signals is averaged over a period of time to provide automatic zero power calibration of the apparatus.

4. A method as claimed in claim 3 wherein the averaging is applied to the said third voltage related signal.

5. A method as claimed in claim 1 wherein the third and fourth signals are produced by phase modulation of the constant frequency signals.

6. Power measuring apparatus adapted to produce an output signal proportional to the product of a supply voltage and current flowing through a load connected thereto, in which a first analogue signal is derived proportional to the said supply voltage and a second analogue signal is derived proportional to the said load current so that a product signal can be produced by a microprocessor corresponding to the power, characterised in that third and fourth signals are produced by frequency modulating two constant frequency carrier signals using the said first and second signals, and the said third and fourth signals are supplied to the microprocessor for multiplication to produce the power product signal, in place of the first and second analogue signals.

7. Power measuring apparatus as claimed in claim 6 wherein the said third and fourth signals are digital signals.

8. Power measuring apparatus as claimed in claim 7 further comprising opto-isolators by which the said third and fourth signals are transmitted to the microprocessor.

9. Power measuring apparatus as claimed in claim 8 wherein the first and second signals are derived using potential dividers and shunts, without electrical isolation from the supply line.

10. Power measuring apparatus as claimed in claim 7 wherein at least one of the first and second signals is an electric current and means is included by which it is converted into a voltage so that both first and second signals are voltages.

11. Power measuring apparatus as claimed in any one of claims 7 to 10 wherein the means for effecting the signal to frequency conversion comprises two voltage controlled pulse generators in which the instantaneous frequency of the pulses from one is controlled by the instantaneous value of the first signal voltage and the instantaneous frequency of the pulses from the other is controlled by the instantaneous value of the second signal voltage.

12. Apparatus for processing the third and fourth signals of claim 7 comprising:
   a) a clock pulse generator for producing a clock pulse signal having a frequency many times that of the mean frequencies of the third and fourth signals,
   b) counter means to which the clock pulses are supplied, continually,
   c) circuit means for capturing values from the counter means,
   d) circuit means responsive to the said third and fourth signals for controlling the capture circuit means to capture first and second counter values at the beginning of each pulse which appears in the said third and fourth signals respectively,
   e) means for storing each captured value,
   f) for both the first and second captured values, means for subtracting the stored captured value from the currently captured value before the currently captured value is inserted into the storage means to form third and fourth difference signals,
   g) circuit means adapted to form the arithmetical reciprocal of each of the said third and fourth difference signals,
   h) means for deriving the respective mean frequencies of the said third and fourth signals,
   i) circuit means for subtracting the said mean values from the reciprocals of the two difference signals to form fifth and sixth signals, and
   j) quadrature multiplying means receptive of the said fifth and sixth signals to multiply the two signals and thereby provide an output signal corresponding to the power being absorbed by the load.

13. Apparatus as claimed in claim 12 wherein a microprocessor is employed for affecting at least the multiplication of the fifth and sixth signals.

14. Apparatus as claimed in claim 13 wherein the processor is programmed to compute therefrom not only the apparent power but also the apparent instantaneous power, the real energy, the real power, and also the reactive energy and the reactive power, supplied to the load.

15. Apparatus as claimed in claim 7 in combination with one of a coin operated mechanism and a card to provide for prepayment of electricity.

16. Apparatus as claimed claim 7 in combination with means for remote reading of data stored within the meter by telemetry such as by power line signal transmission, wherein the meter includes receiver means for decoding data transmitted to the meter and transmitter means for modulating a carrier for transmission of data contained in the meter.

17. Apparatus as claimed in any one of claims 7 to 16 further comprising switch means for interrupting the supply of electric current from the meter to the load.

18. Apparatus as claimed in claim 17 wherein the switch means is remotely controllable by one of the means of telemetry and power line signal transmission.

19. Apparatus as claimed in claim 18 further comprising receiver means for receiving signals for said remote control, and adapted to generate a control signal for operating the switch means on or off in response to the receipt and decoding of appropriate command signals.

20. Apparatus as claimed in claim 19 further comprising means for local operation of the switch means or separate locally operable switch means for interrupting the supply of electric current to the load.

21. Apparatus as claimed in claim 7 further comprising display means for displaying in readable format the accumulated power measured by the meter.

22. Apparatus as claimed in claim 21 wherein the display means is an LCD display.

23. Apparatus for generating a product of signals proportional to the voltage of an electrical supply and the current flowing through a load connected thereto, comprising circuit means adapted to be connected to an electricity supply for producing one output signal proportional to the potential difference betwen the live and neutral wires of the supply, and another output signal proportional to the current flowing in the live wire of the supply, wherein current sensing means is provided for producing a signal relating to the instantaneous magnitude of the current flowing in the live wire, first frequency modulation circuit means is provided for converting this signal into a pulse train whose frequency is representative of the current, voltage sensing means is provided for producing a signal proportional to the instantaneous magnitude of the potential difference between the live and neutral wires of the supply, second frequency modulation circuit means is provided for converting this signal into a pulse train whose frequency is representative of the potential difference, circuit means is provided for obtaining signals representing the mean frequencies of the two pulse trains, and multiplier means is provided for multiplying together the two mean frequency signals in order to obtain the required product.

24. Apparatus as claimed in claim 23 wherein the two pulse trains are in the form of digital signals, the frequency of one varying with the voltage and the frequency of the other varying with the current respectively, and wherein electrical isolation employing optoisolators is provided for transferring the frequency information to a microprocessor based circuit whereby power directly derived from the live and neutral lines of the power supply is employed for powering voltage and current frequency modulation circuits to produce the two pulse trains.

* * * * *